(12) United States Patent
Koh et al.

(10) Patent No.: US 6,787,441 B1
(45) Date of Patent: Sep. 7, 2004

(54) METHOD FOR PRETREATING A POLYMER SUBSTRATE USING AN ION BEAM FOR SUBSEQUENT DEPOSITION OF INDIUM OXIDE OR INDIUM TIN OXIDE

(75) Inventors: Seok-Keun Koh, Seoul (KR); Young-Whoan Beag, Seoul (KR); Jun-Sik Cho, Seoul (KR); Young-Gun Han, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 10 days.

(21) Appl. No.: 10/182,986

(22) PCT Filed: Aug. 30, 2000

(86) PCT No.: PCT/KR00/00985

§ 371 (c)(1),
(2), (4) Date: Nov. 13, 2002

(87) PCT Pub. No.: WO01/61065

PCT Pub. Date: Aug. 23, 2001

(30) Foreign Application Priority Data

Feb. 15, 2000 (KR) .......................................... 07024/2000

(51) Int. Cl.[7] .............................. H01L 21/44; C08J 7/18
(52) U.S. Cl. ........................ 438/608; 427/532; 427/536
(58) Field of Search ........................ 438/608; 427/533, 427/536, 535, 539, 126.3

(56) References Cited

U.S. PATENT DOCUMENTS

| 4,560,577 A | * | 12/1985 | Mirtich et al. ............... 427/533 |
| 5,133,849 A | * | 7/1992 | Kinoshita et al. ....... 204/298.05 |
| 5,783,641 A | * | 7/1998 | Koh et al. ................. 525/333.8 |
| 5,856,858 A | | 1/1999 | Carey et al. ................. 349/158 |

FOREIGN PATENT DOCUMENTS

| EP | 0 675 157 | | 10/1995 | .............. C08J/7/04 |
| JP | 02-250953 | | 10/1990 | ........... C23C/14/02 |
| JP | 03065337 A | * | 3/1991 | ........... B32B/15/08 |
| JP | 04206212 A | * | 7/1992 | ........... H01B/13/00 |
| JP | 06068713 A | * | 3/1994 | ........... H01B/05/14 |
| JP | 06-145964 | | 5/1994 | ........... C23C/14/24 |
| JP | 08017267 A | * | 1/1996 | ........... H01B/13/00 |
| JP | 08-017267 | | 1/1996 | ........... H01B/13/00 |
| JP | 09-195034 | | 7/1997 | ........... C23C/14/02 |
| JP | 10016112 A | * | 1/1998 | ........... B32B/07/02 |
| JP | 10-016112 | | 1/1998 | ............. B32B/7/02 |
| JP | 10-186130 | | 7/1998 | ............ G02B/5/28 |

OTHER PUBLICATIONS

Vossen and Kern, Thin Film Processes, Academic Press: San Diego, 1978 pp. 76–79 and 86.*
W.F. Wu et al., "Deposition of indium tin oxide films on Polycarbonate substrates by radio–frequency magnetron Sputtering" Thin Solid Films, vol. 298 (1997) pp. 221–227.
A.K. Kulkami et al., "Electrical, optical, and structural properties of indium–tin–oxide thin films deposited on polyethylene terephthalate substrates by rf sputtering" J. Vac. Sci. Technol. A, vol. 16, No. 3, (May/Jun. 1998) pp. 1636–1640.
J. Ma et al., "Preparation and characterization of ITO films deposited on polymide by reactive evaporation at low temperature" Applied Surface Science, vol. 151 (1999) pp. 239–243.

* cited by examiner

*Primary Examiner*—Erik Kielin
(74) *Attorney, Agent, or Firm*—Darby & Darby

(57) ABSTRACT

A method of depositing indium oxide or indium tin oxide thin film on a polymer substrate is disclosed. In the method, oxygen or argon ion beam is radiated on a polymer substrate by a constant accelerating energy in a vacuum state to modify the surface of the polymer substrate, on which an IO thin film or an ITO thin film is deposited while oxygen ion beam, argon ion beam or their mixture ion beam is being radiated in a vacuum state. In addition, ion beam is generated from a cold cathode ion source by using argon, oxygen or their mixture gas and sputtered at a target substance composed of $In_2O_3$ or $In_2O_3$ and $SnO_2$, thereby an IO or an ITO thin film can be deposited on the surface-modified polymer substrate.

18 Claims, 16 Drawing Sheets

METHOD FOR PRETREATING A POLYMER SUBSTRATE USING AN ION BEAM FOR SUBSEQUENT DEPOSITION OF INDIUM OXIDE OR INDIUM TIN OXIDE

TECHNICAL FIELD

The present invention relates a method for depositing an indium oxide or an indium tin oxide thin film on a polymer substrate, and more particularly, to a process in which a surface of a polymer substrate is modified by using an ion beam having an energy and a transparent and conductive indium oxide or indium tin oxide thin film is deposited thereon by an ion assisted deposition and/or an ion beam sputtering method.

BACKGROUND ART

A transparent conductive thin film is electrically conductive and has a high transparency in a visible ray.

By using such inherent property, the transparent conductive thin film is adopted to various fields such as an antistatic film in the optical field such as a Braun tube or glasses, an electrode of an LCD or semiconductors, electrode of solar battery or gas sensor.

Up till now, as a substrate for depositing the transparent conductive thin film, glasses have been used, and in order to fabricate thin films on the glasses, various methods such as an RF-sputtering, a DC-sputtering, a thermal evaporation, a chemical vapor deposition (CVD) and sol-gel method have been used.

Recently, with the development of an electronic industry, products becomes compact and light rapidly. According to the tendency, attempts has proceeded to deposit the transparent conductive thin film on a polymer substrate instead of a glass substrate.

In case of using the polymer substrate instead of a glass substrate, there is advantages that a product can be light and is hardly broken. In addition, since the polymer substrate has a flexibility, it is possible to fabricate a flexible circuit board which would be easily carried.

However, in spite of such advantages, there are many restrictions to use the polymer substrate instead of the glass substrate.

For example, first since the polymer substrate has a low surface energy compared with the glass substrate, it has a weak adhesive force with respect to a thin film to be deposited thereon.

Accordingly, there have been many attempts to increase the surface energy of a polymer, for which plasma or a chemical processing method has been mostly used.

However, these methods have a problem that it does a big physical and chemical damage to the surface of the polymer, the transparency of a substrate is reduced or the adhesive characteristic is not much improved.

In addition, in case that the existing deposition method is used to fabricate the transparent conductive thin film on the polymer substrate, the substrate must be heated at more than 200° C. However, this temperature range is higher than a melting point of the polymer, and then it is difficult to use the polymer as a substrate.

Therefore, an object of the present invention is to provide a method for depositing an indium oxide (IO) and an indium tin oxide (ITO), a transparent conductive thin film, at a low substrate temperature, especially at a room temperature, by using a processing method which does not do any damage to a transparency of a polymer substrate and a chemical stability of a surface-modified layer of a polymer substrate.

DETAILED DESCRIPTION OF THE INVENTION

In order to achieve the above objects, there is provided a method for depositing an IO or an ITO thin film on a polymer substrate, in which oxygen or argon ion beam is applied on a polymer substrate with a certain acceleration energy to modify the surface of the polymer substrate, on which an IO or an ITO thin film is deposited while applying oxygen, argon or oxygen-argon mixed ion beam under vacuum.

In order to achieve the above objects, there is further provided a method for depositing an IO or an ITO thin film on a polymer substrate, including the steps of: applying oxygen or argon ion beam on the polymer substrate with a certain acceleration energy to modify a surface of the polymer substrate; generating an ion beam from a cold cathode ion source by using argon, oxygen or its mixture gas under vacuum; sputtering the ion beam to a target substance consisting of $In_2O_3$ or $In_2O_3$ and $SnO_2$; and depositing an IO or the ITO thin film on the surface-modified polymer substrate.

MODE FOR CARRYING OUT THE PREFERRED EMBODIMENTS

Figure 1:
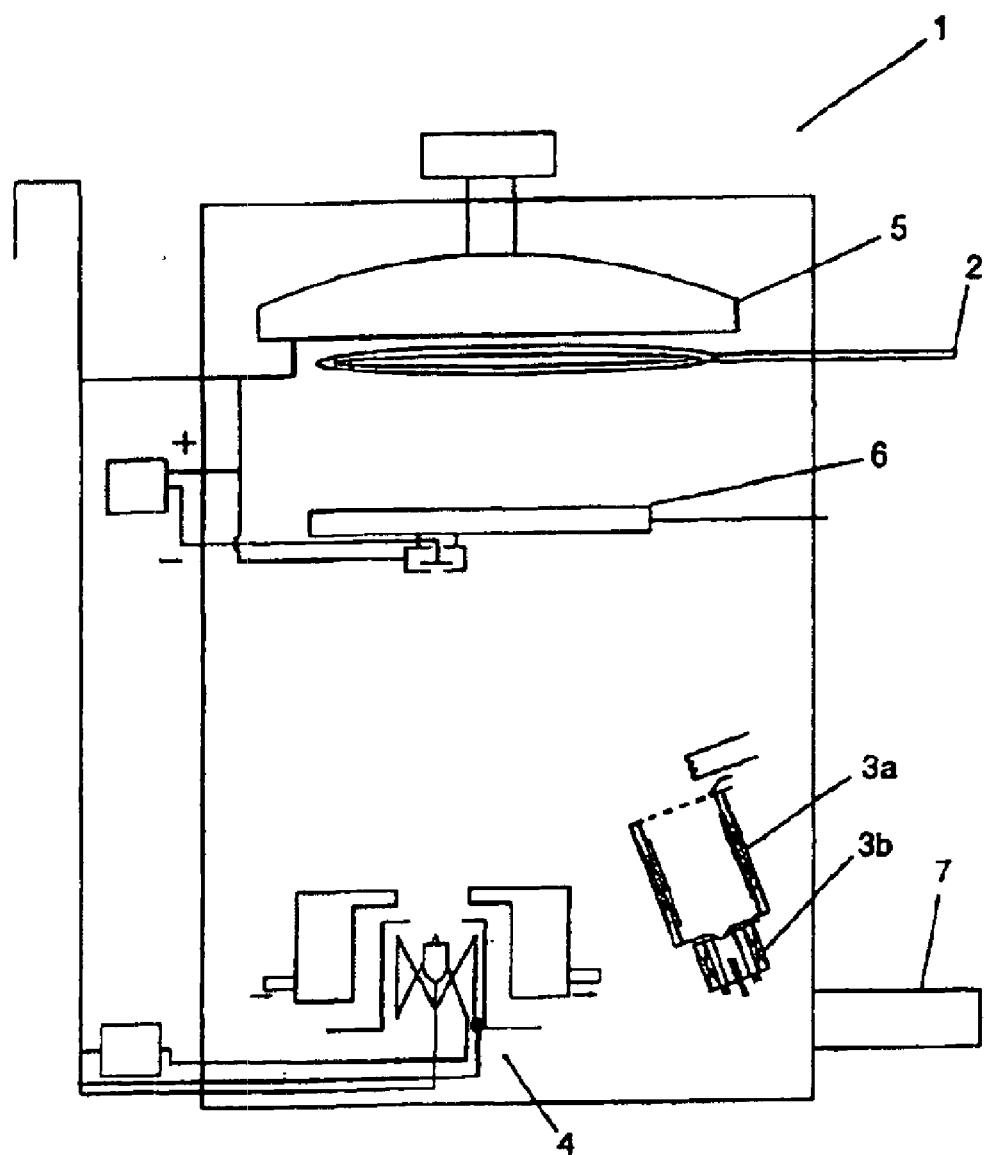
FIG. 1 is a schematic view showing the construction of a polymer surface processing and thin film depositing apparatus using an ion beam in accordance with a preferred embodiment of the present invention.

The present invention will now be described with reference to accompanying drawings.

In a preferred embodiment of the present invention, in order not to damage the transparency of a substrate or a chemical stability of a modified layer, a surface of polymer is modified to have a hydrophilia by an ion beam, through which the surface energy at the polymer surface Is increased to improve an adhesive force with respect to a transparent conductive thin film to be deposited thereon.

Next, an IO and an ITO thin film, transparent and conductive thin films, are fabricated on the surface-modified polymer substrate at a substrate temperature lower than 200° C. inclusive of a room temperature by using an ion-assisted deposition method and an ion beam sputtering method, thereby improving transparency, an electric characteristic and an adhesive force to the polymer substrate of the deposited thin film.

A feature of the ion-assisted deposition method of the present invention is that when the thin film is deposited, an ion having an energy is irradiated, which substitutes an energy according to heating of a substrate, and since oxygen is ionized for irradiating, a high reactivity is expected compared to flowing in an oxygen gas of a neutral state, so that an oxide such as the IO or the ITO thin film can be fabricated even without heating the substrate.

In addition, the polymer surface can be improved until the thin film completely forms a single layer by irradiating ionized oxygen, and an adequate irradiation of an energy advantageously makes the fabricated thin film to be dense and reduces roughness at the surface.

In the preferred embodiment of the present invention, the IO or the ITO thin film is fabricated by using the ion beam sputtering method. The ion beam sputtering method is to deposit a desired material on a neighboring substrate by rendering ions, a gas of a high energy state, to collide with a target of the material desired to be deposited.

The ion beam sputtering method has the following advantages.

First, by isolating the ion source from the substrate, a temperature of the substrate can be accurately controlled, and by avoiding collision of the high energy particles, the film deposited on the substrate has an excellent adhesive force.

Secondly, thanks to the relatively less amount of a plasma gas for generating ions, contamination due to the reactive gas can be reduced through deposition in a high vacuum, and the deposited film is very densely formed.

Thirdly, since the ion beam energy and the ion beam current density are independently controllable, it is advantages to clarify a growth mechanism of a thin film by using the ion beam.

Meanwhile, the homeostasis of the ion source is maintained regardless of an exchange of the substrate and the target material.

A method for depositing an indium oxide or an indium tin oxide thin film on a polymer substrate in accordance with a preferred embodiment of the present invention will now be described in detail with reference to the accompanying drawings.

FIG. 1 illustrates an ion beam modifying apparatus and an ion beam-assisted deposition apparatus adopted in the present invention.

As shown in FIG. 1, a vacuum container 1 includes a gas flow inlet 2 for inducing a reactive gas thereinto, an ionizing unit 3a for ionizing a gas, an ion source 3b including an accelerator for accelerating gas ions and drawing out as ions, and heating type evaporator 4 for evaporating the IO or the ITO source.

Reference numerals 7 denotes a vacuum exhaust outlet, 5 denotes a substrate holder, and 6 denotes a shutter.

The ion source used in the preferred embodiment of the present invention is a cold hallow cathode ion source which is capable of precisely controlling the energy of ions and the number of ions.

EXAMPLE 1

The surface of a polymer substrate was modified to have a hydrophilia under the following experimental conditions:

Vacuum degree was $1\times10^{-6}$ Torr, an acceleration voltage was 300~1000V, polycarbonate (PC) was used as a material for surface modification, and an ion injection amount was $5\times10^{14}$~$1\times10^{17}$ ion/cm$^2$.

Figure 2:
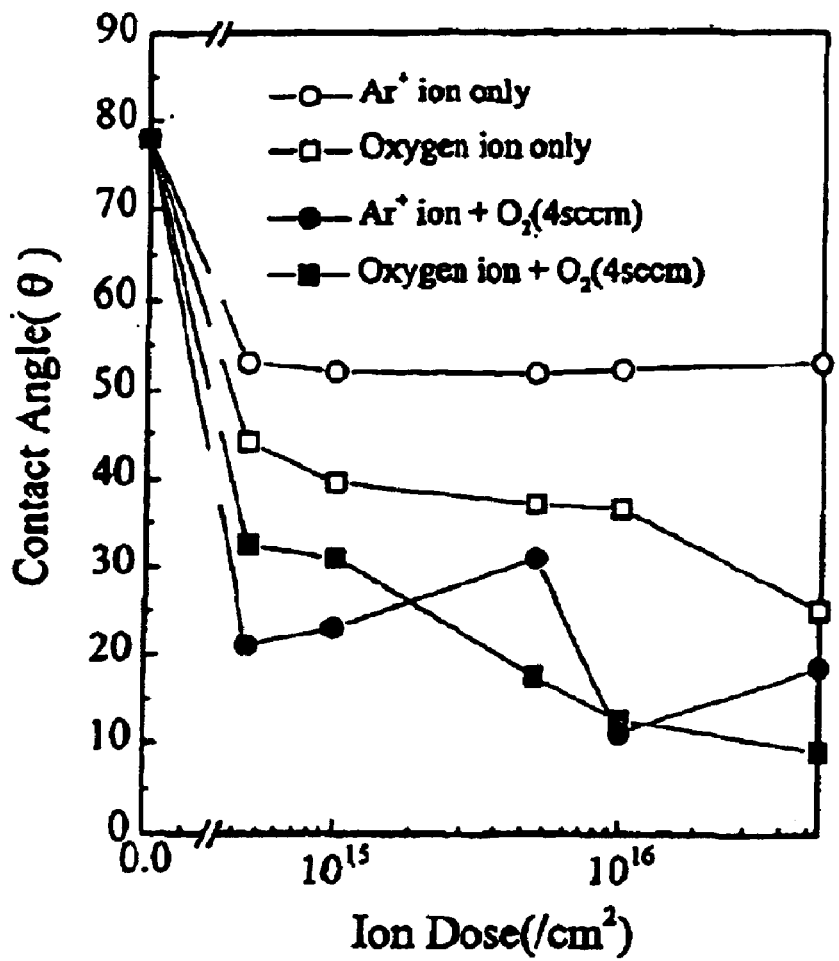
FIG. 2 is a graph showing a contact angle variance of water to a polycarbonate surface which has been subjected to surface processing by an ion beam in accordance with the preferred embodiment of the present invention.

FIG. 2 shows contact angle variance with respect to water according to ion irradiation amount of the PC which has been subjected to surface processing by irradiating argon and oxygen ions according to existence and nonexistence of an oxygen atmosphere, after the acceleration energy of the ions is fixed at 1000 eV.

In case that only argon or oxygen is irradiated without the oxygen atmosphere, the contact angle was reduced to 55° and 25° lower than 78°, the initial contact angle, according to the ion irradiation amount.

Meanwhile, under the oxygen atmosphere, the contact angle was reduced to the lowest 9° and 10°.

Thus, ii is noted that the polymer surface modification at the oxygen atmosphere was more effective to reduce the contact angle.

Figure 3:
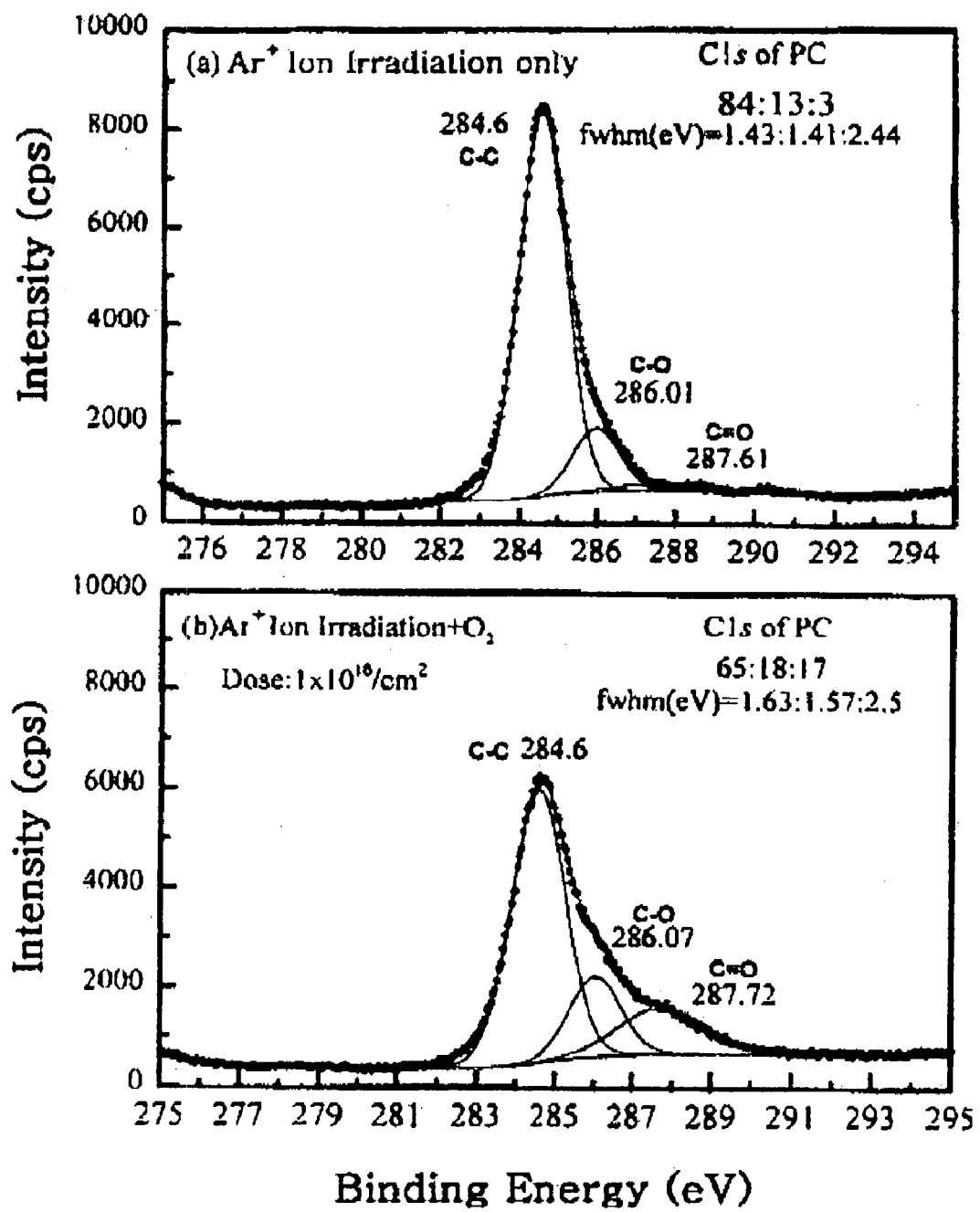
FIG. 3 are graphs showing an XPS result of a chemical change of the polycarbonate surface which has been subjected to surface processing by an ion beam in accordance with the preferred embodiment of the present invention.

FIG. 3 illustrates an x-ray photoelectron spectroscopy (XPS) showing chemical variance of the surface of the polycarbonate which was surface-processed with the argon ion beam at the oxygen atmosphere.

As shown in FIG. 3, it is noted that the amount of hydrophilic carbonyl (C=O) was increased on the surface of the polycarbonate (b) modified with the argon ion beam at in the oxygen atmosphere more than that of a test sample (a) which was processed only with argon ions.

When the hydrophilic radical is increased on the polymer surface, the surface energy of the polymer is increased.

Figure 4A:
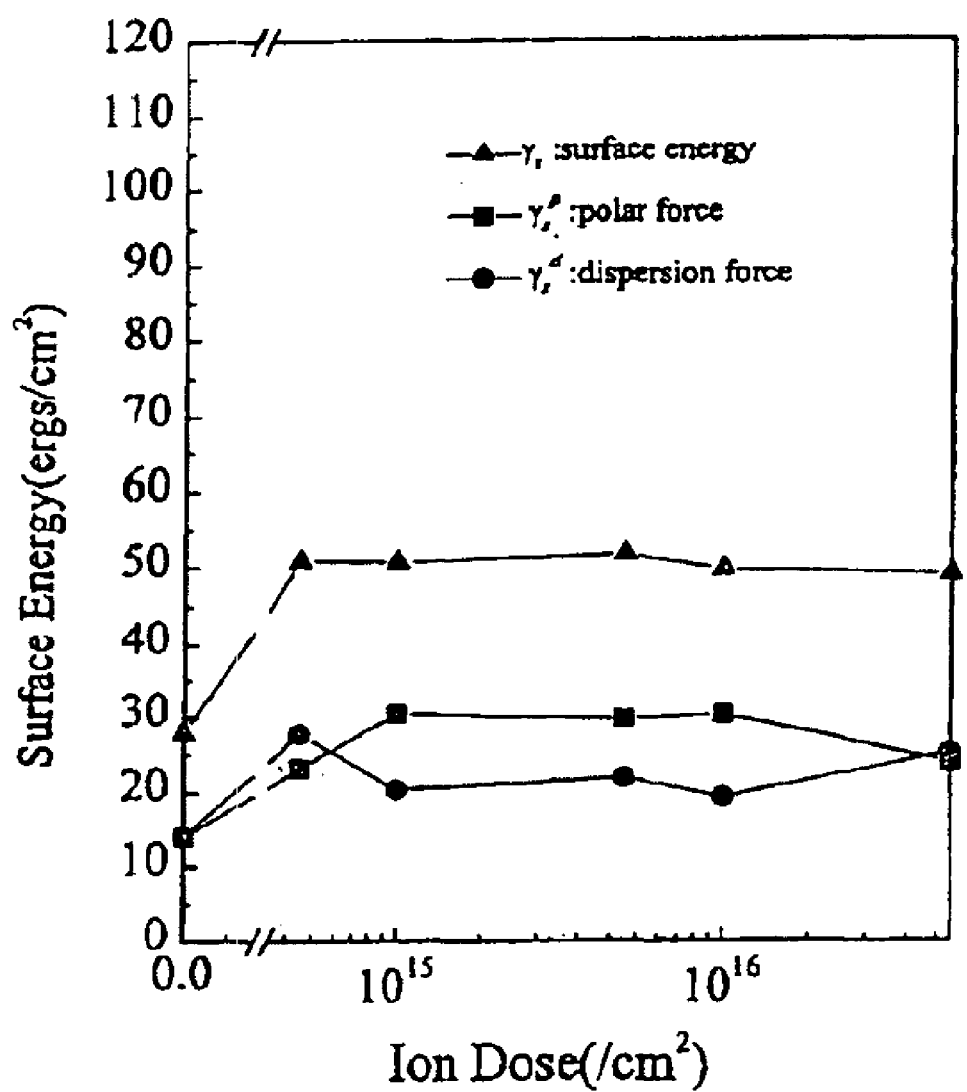
FIGS. 4A and 4B are graphs showing surface energy variance of the polycarbonate surface which has been subjected to surface processing by an ion beam in accordance with the preferred embodiment of the present invention.
Figure 4B:
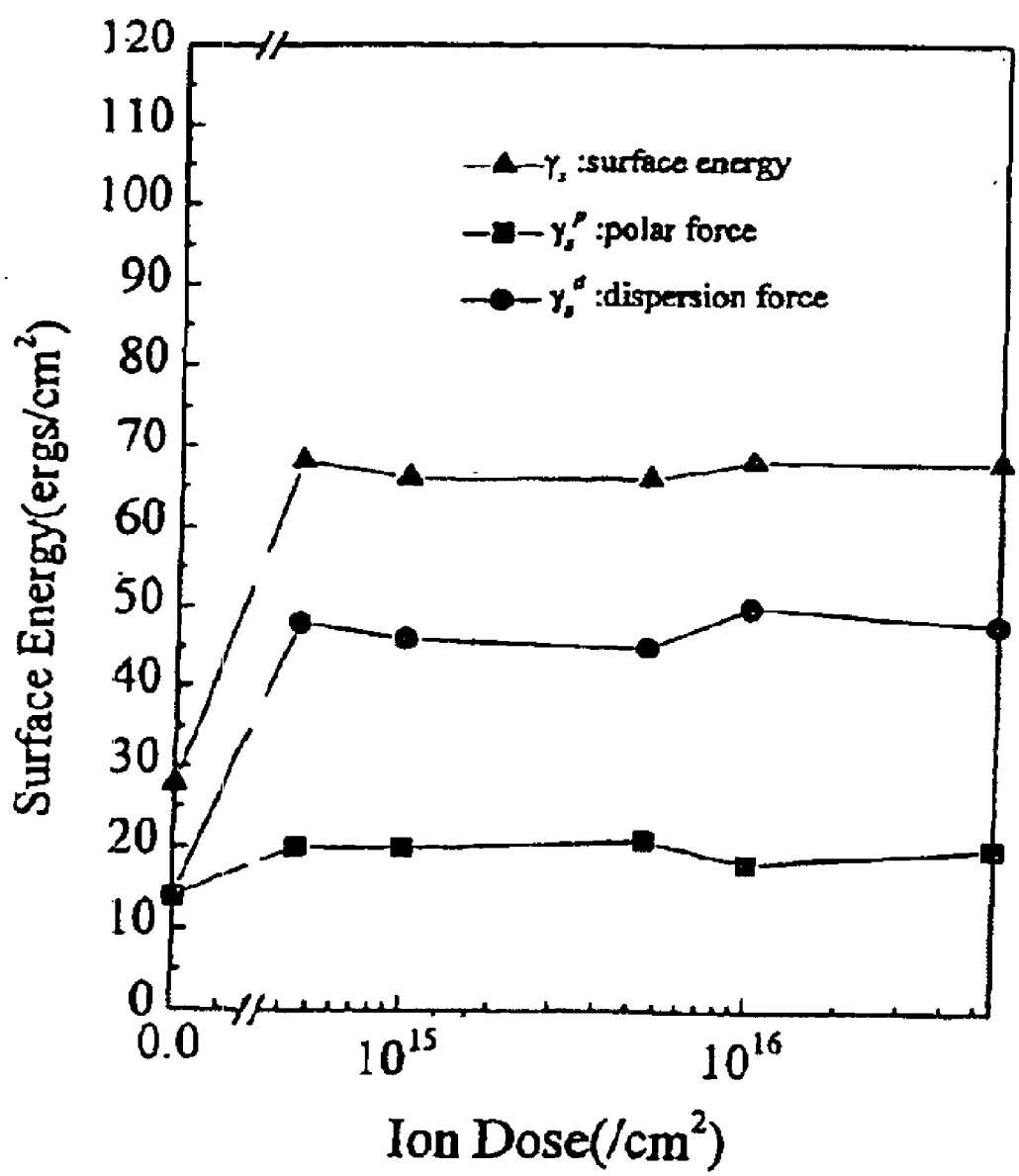

FIGS. 4A and 4B show variance of the surface energy of the modified polycarbonate.

As shown in FIGS. 4A and 4B, when the surface of the polycarbonate was modified only with the argon ions (FIG. 4A), it has the surface energy of 50 ergs/cm$^2$, while, when the surface of the polycarbonate was modified at the oxygen atmosphere (FIG. 4B), its surface energy was increased up to 70 ergs/cm². This results mainly from the increase in a polar force according to generation of the hydrophilic radical.

Besides the above described polycarbonate, a surface of various polymers such as polyethylene, polypropylene, polyterephthalate can be possibly subjected to the hydrophile process.

The ITO thin film was deposited on the polymer having an increased hydrophilia and adhesiveness through the ion beam modification at a temperature lower than 200° C. through the ion-assisted depositing method.

Under the following experimental condition, a thin film was deposited on the polymer substrate modified by the ion beam. A vacuum degree was $1 \times 10^{-4} \sim 1 \times 10^{-6}$ Torr, an acceleration voltage was 0~500V, an Ion beam was oxygen ions or mixture ions of oxygen ions and argon ions, an ion beam current density was 0~30 $\mu$A/cm², and a deposition temperature was 25~200° C. By using a heating type evaporation apparatus, an In metal, an In—Sn alloy, an ITO shot were deposited at a constant rate, and then ions of oxygen, argon or mixture of the argon or oxygen were checked by using an ion gun.

Figure 5:
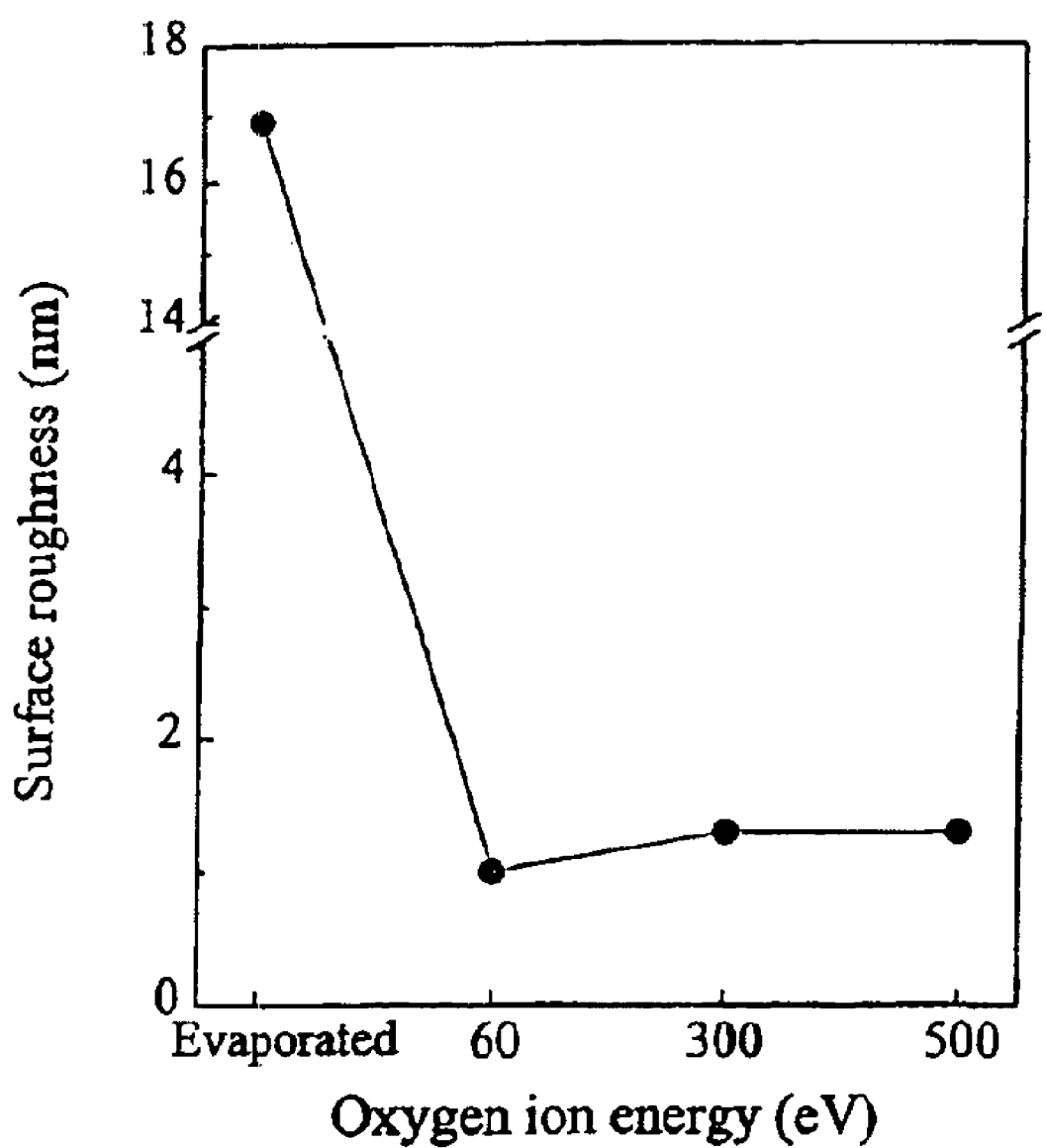
FIG. 5 is a graph showing surface roughness variance of an ITO thin film deposited by an ion-assisted deposition method on polymer which has been subjected to surface processing by ion beam in accordance with the preferred embodiment of the present invention.

FIG. 5 is a graph showing surface roughness variance according to an ion beam energy.

Referring to a surface roughness of the deposited thin film, in case of the thin film deposited without an ion-assisted deposition exhibits a 17 nm rough surface characteristic, while, in case of the thin film fabricated by the ion-assisted deposition, its surface roughness was below 1.5 nm, exhibiting a even surface.

The surface roughness of the thin film has much influence on the transmittance or the electric conductance of the thin film. Thus, such low surface roughness value allows fabrication high quality thin film with high transmittance and low resistance.

Figure 6:
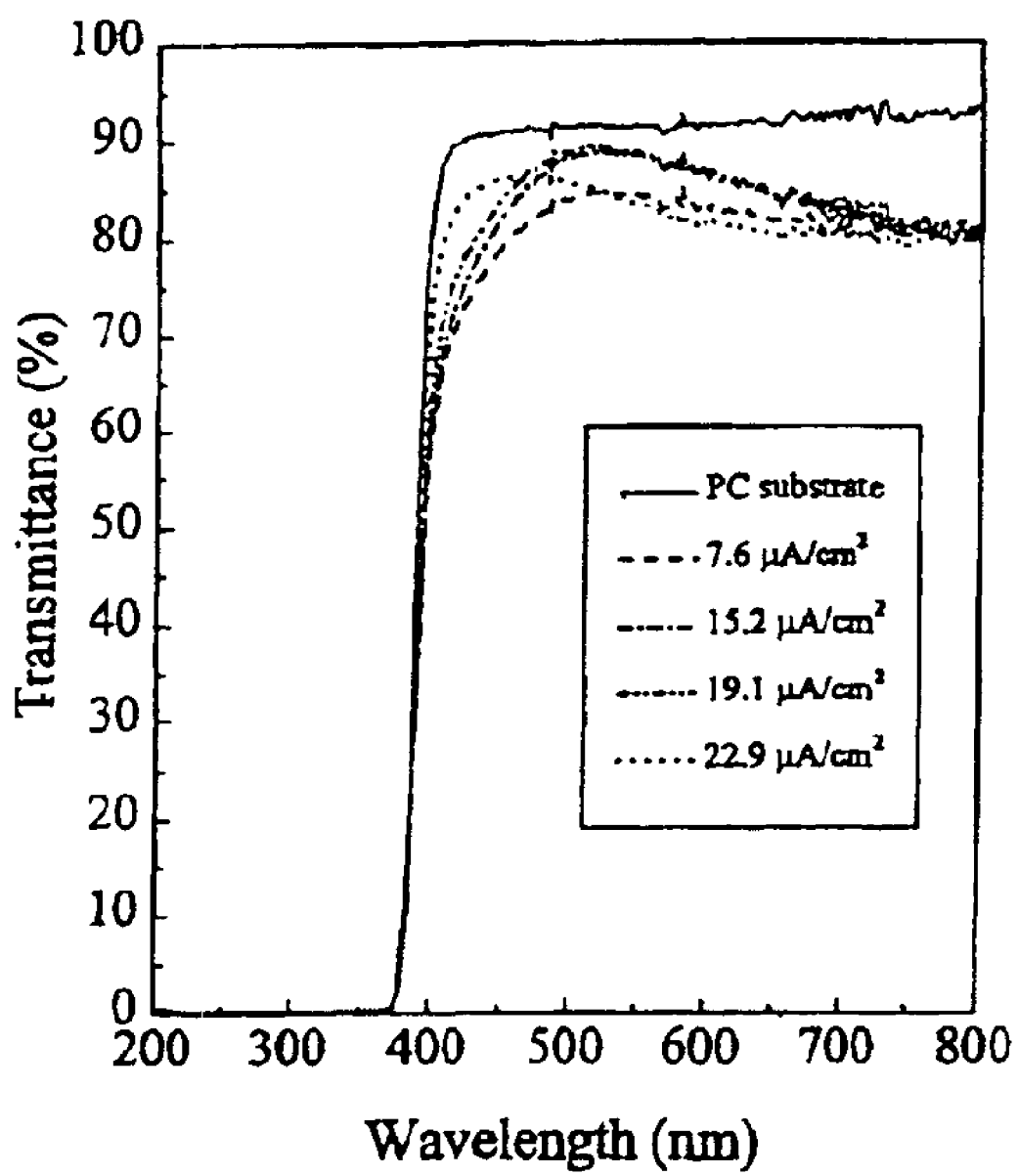
FIG. 6 is a graph showing transmittance rate of the ITO thin film deposited by an ion-assisted deposition method on polymer which has been subjected to surface processing by ion beam in accordance with the preferred embodiment of the present invention.

FIG. 6 is a graph showing transmittance variance of the deposited thin film to a visible ray according to a variation of a current density.

Before deposition, polycarbonate exhibits a 90% transmittance in the region of visible ray, and the transmittance of the deposited thin film was varied according to the variation of the ion current density, exhibiting the maximum 87% transmittance. Since the transmittance value involves the light absorption to the substrate itself, a transmittance of the thin film itself is considered more than 90%.

Figure 7:
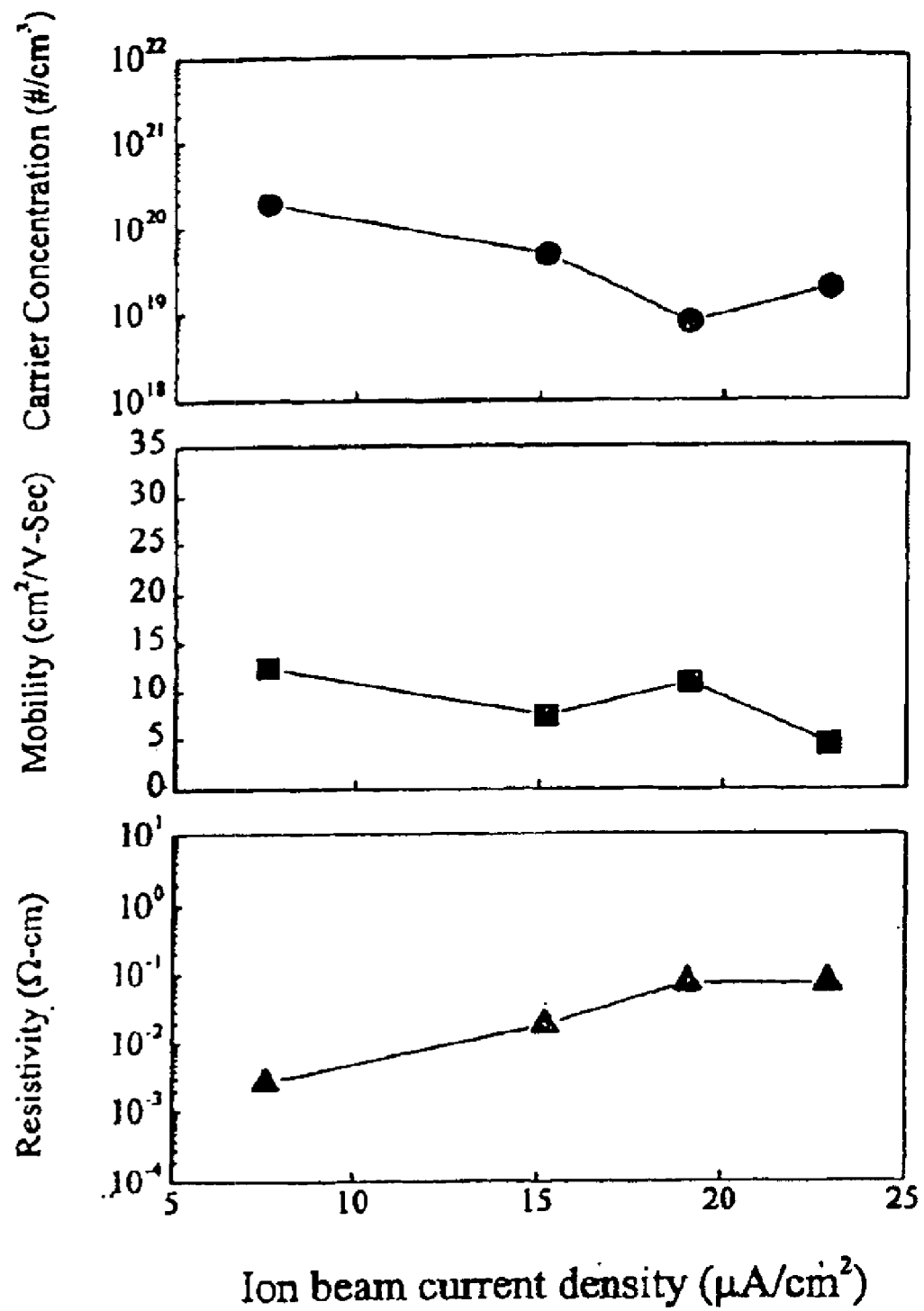
FIG. 7 is graphs showing electrical characteristic variance of the ITO thin film deposited by an ion-assisted deposition method on polymer which has been subjected to surface processing by ion beam in accordance with the preferred embodiment of the present invention.

FIG. 7 shows variance of a carrier concentration, a mobility and a resistivity of the deposited thin film according to an ion current density.

As shown in FIG. 7, the resistivity of the deposited thin film was increased depending on the ion beam current density, resulting from the fact that the carrier concentration is reduced as the ion beam current density is increased.

With this result, the ion current density may be changed to change the carrier concentration of the deposited thin film, and accordingly, the resistivity of the thin film can be changed.

EXAMPLE 2

In the same manner as that of Example 1, an ITO thin film was deposited on a surface-modified polymer by using the ion beam sputtering method.

Figure 8:
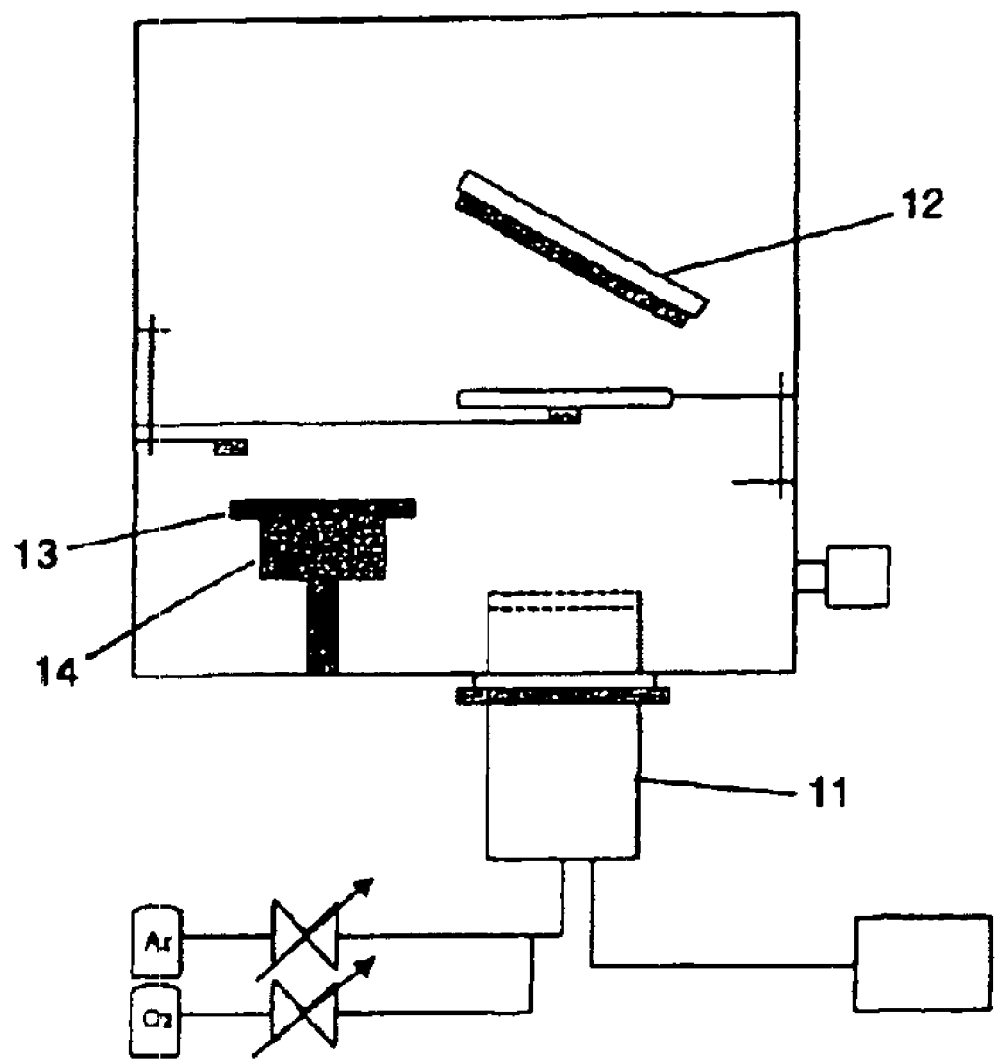
FIG. 8 is a schematic view of an ion beam sputtering apparatus adopted in accordance with the preferred embodiment of the present invention.

FIG. 8 is a schematic view of an ion beam sputtering apparatus used in the preferred embodiment of the present invention. The apparatus is the same as that used for the surface modification and the ion beam-assisted deposition method, including an Ion source 11, a sputtering target 12, a substrate holder 13 and a heating plate 14.

The conditions for depositing the ITO thin film through the ion beam sputtering method were as follows.

An ion source was a cold hallow cathode ion source. A target material was 90 wt % $In_2O_3$ and 10 wt % $SnO_2$. As for a vacuum degree, a base pressure was $1 \times 10^{-5}$ Torr and a working pressure was $2 \times 10^{-4}$ Torr. Ion gas was argon, oxygen or their mixture gas. An acceleration voltage was 700~1300V. An ion current density was 0.5~50 $\mu$A/cm². A deposition temperature was below 200° C.

Figure 9:
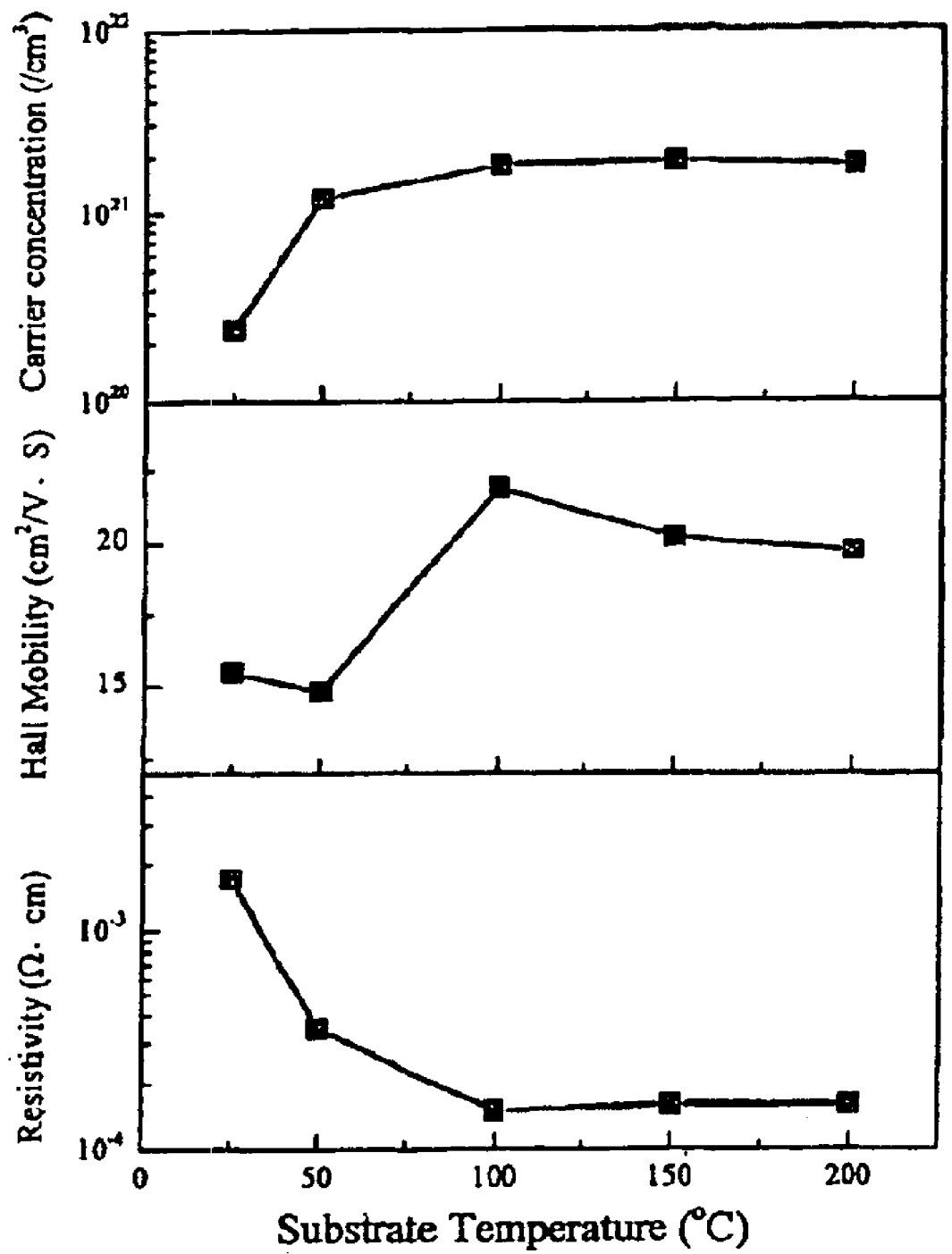
FIG. 9 is a graph showing variance of resistivity, concentration of electrons and mobility of the ITO thin film according to temperature variance of a polymer substrate in accordance with the preferred embodiment of the present invention.
Figure 10A:
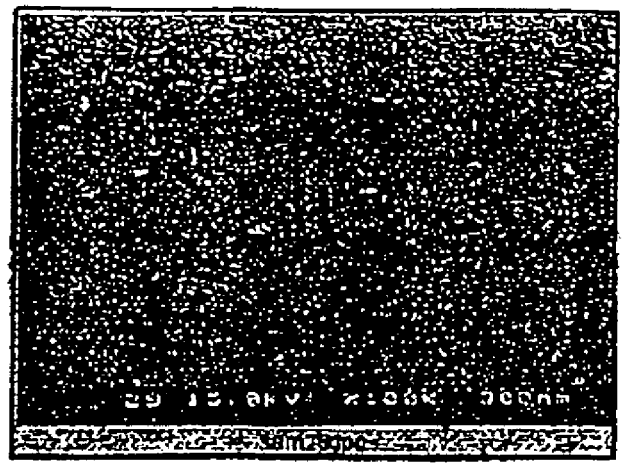
FIGS. 10A through 10D are photographs showing variance of microstructure of the ITO thin film according to temperature variance of a polymer substrate in accordance with the preferred embodiment of the present invention.
Figure 10B:
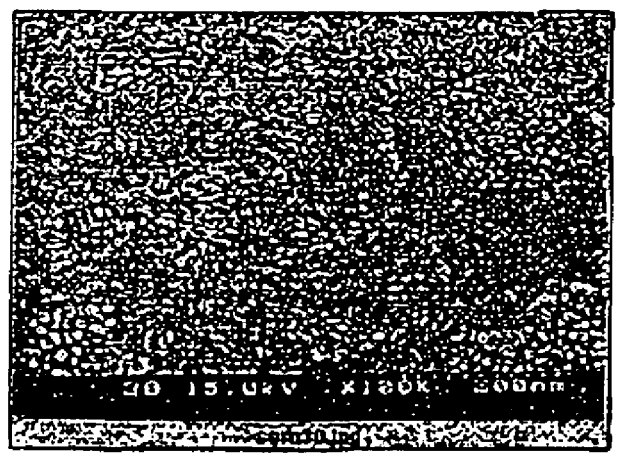
Figure 10C:
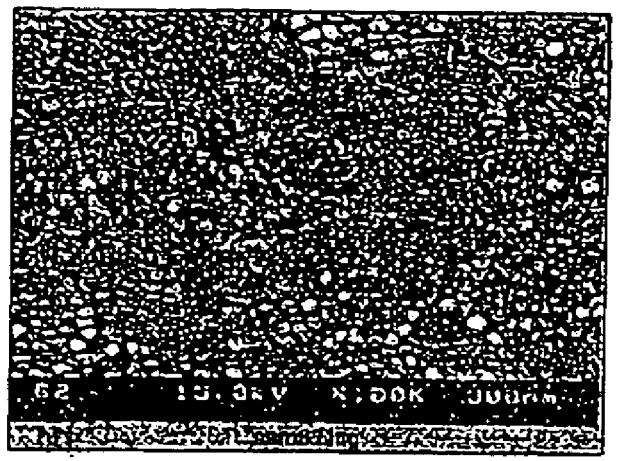
Figure 10D:
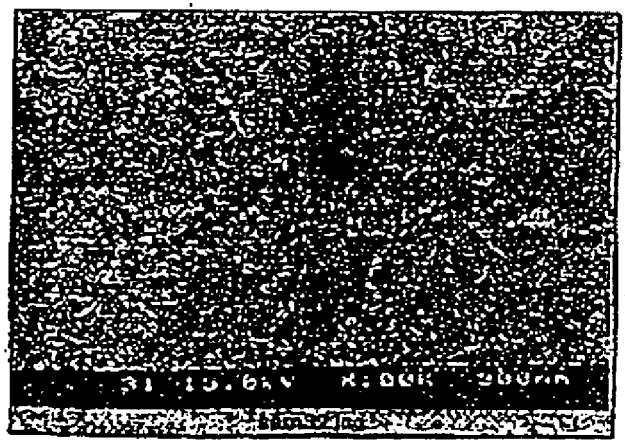

FIG. 9 is a graph showing variance of resistivity, concentration of electrons and mobility as the substrate is heated.

As shown in FIG. 9, it is noted that as a temperature of the substrate is higher than 90° C., the concentration of electrons is rapidly increased, and it is increased up to $1.8 \times 10^{21}$/cm³ at a temperature of 100° C.

At this time, a resistivity value is $1.5 \times 10-4\Omega$ cm, very low. This value can be obtained at a substrate temperature of higher than 300° C. in case of using the existing sputtering method.

FIGS. 10A through 10D are photographs showing SEM images of the ITO thin film according to heating of the substrate.

It exhibits an amorphous structure at a substrate temperature of up to 50° C. (referring to FIG. 10B), but in case of 100° C. at which the lowermost non-resistance value was obtained (referring to FIG. 10C), notably, it exhibits a crystallization in a large domain structure consisting of small sub-grains on the whole.

In this respect, in comparison with the variance of the mobility of FIG. 9, the domain structure has a considerably great mobility.

This can be explained by a low grain boundary scattering among various electron scattering factors. That is, at the temperature of 100° C., the concentration of electrons and the mobility of the ITO thin film record the maximum value. Meanwhile, at a temperature of higher than 150° C., it was observed that the domain structure was changed to a general grain structure (referring to FIG. 10D). Accordingly, the mobility was considerably reduced as confirmed with reference to FIG. 9.

Figure 11A:
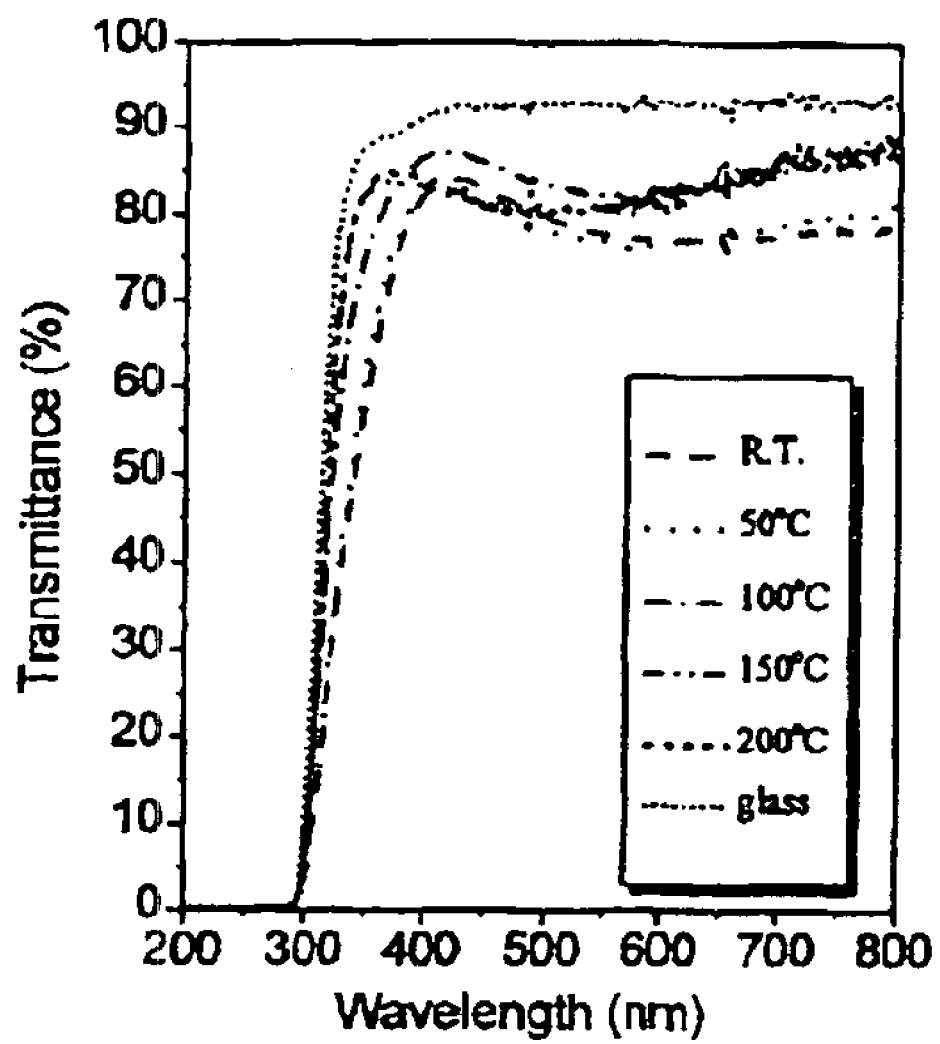
FIGS. 11A and 11B are graphs showing light transmittance of the ITO thin film according to temperature variance of a polymer substrate and variance of an optical band gap computed based on it in accordance with the preferred embodiment of the present invention.

FIG. 11A shows a transmittance variance of the ITO thin film according to heating of the substrate.

As shown in FIG. 11A, in case of the ITO thin film deposited at 100° C., a transmittance at visible ray region of 550 nm was 85%.

In consideration of the fact that the transmittance of the used substrate is 90% in the region of visible ray, the transmittance of the deposited ITO thin film itself is considered to have a value higher than 90%.

Figure 11B:
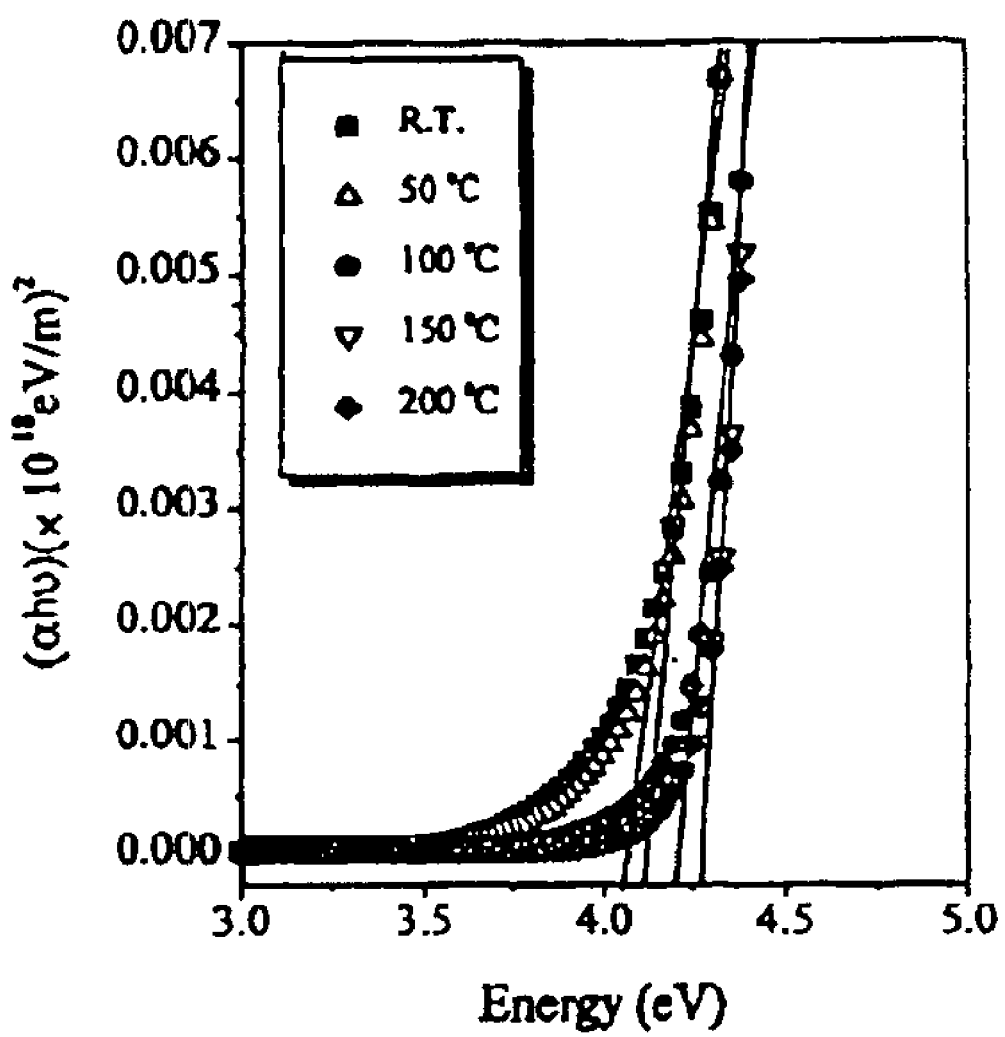

FIG. 11B is a graph showing an optical band gap of the ITO thin film computed from a light transmittance spectrum, exhibiting about 4.2 eV.

Figure 12A:
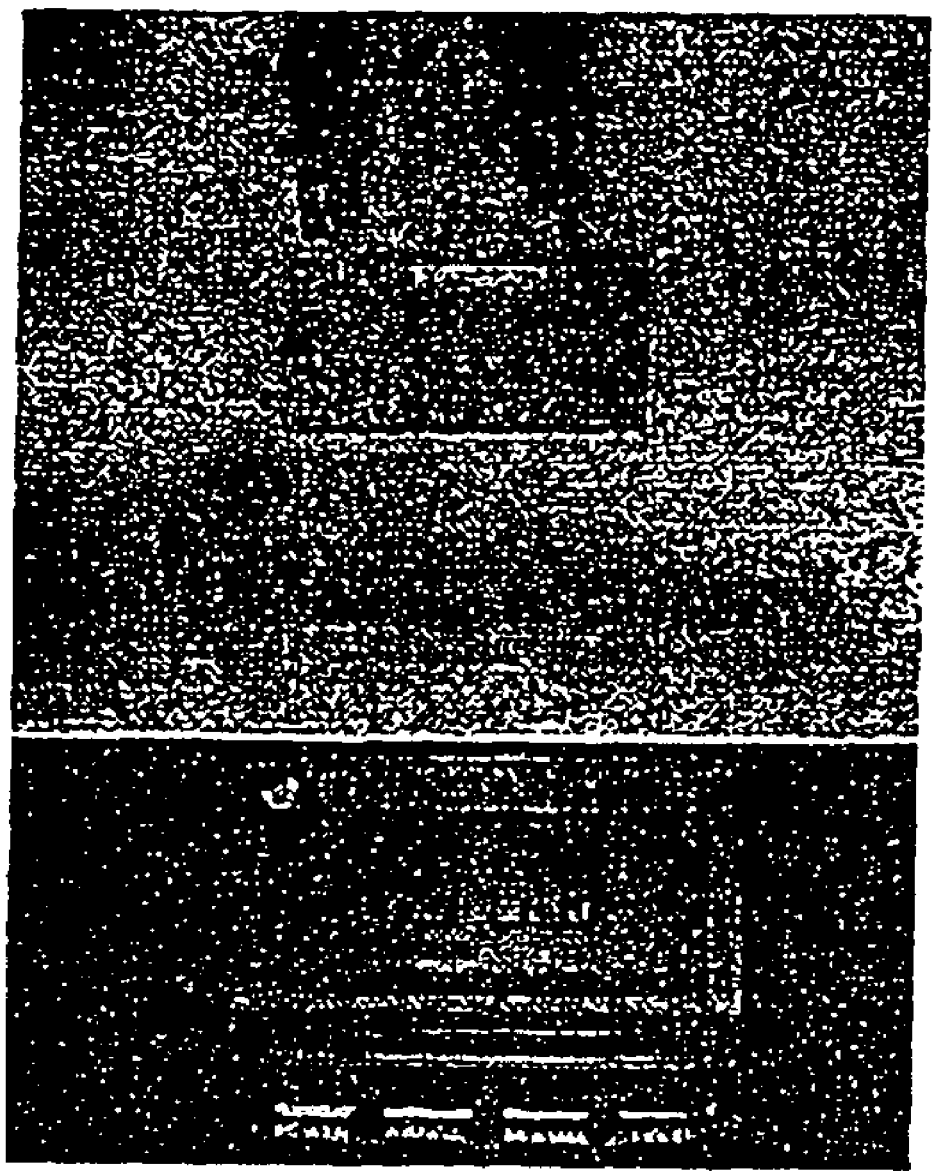
FIGS. 12A and 12B are photographs showing adhesive force experiment result using a 3M tape test of the ITO thin film deposited on the polymer modified with the ion beam in accordance with the preferred embodiment of the present invention.
Figure 12B:
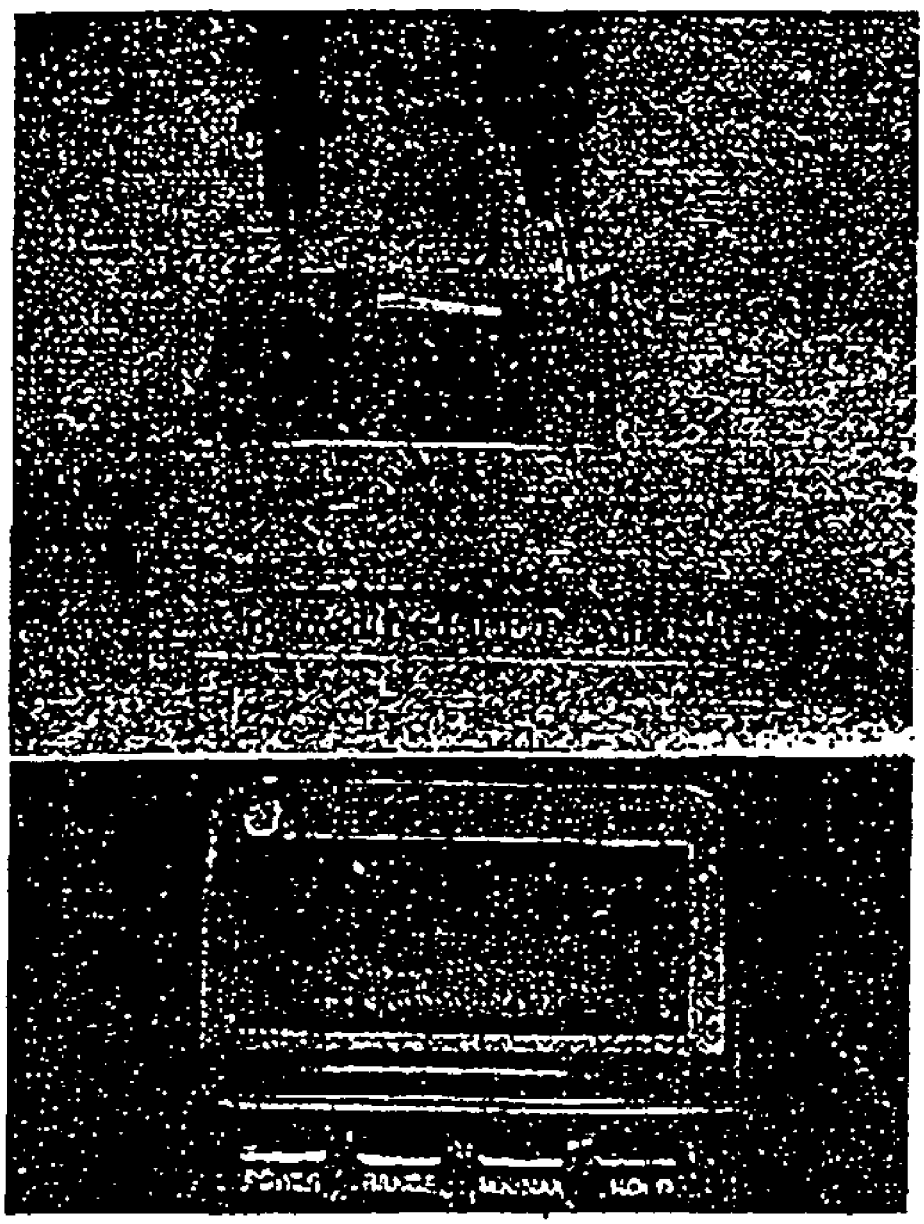

An adhesive force of the ITO thin film deposited on the polymer substrate polycarbonate (PC) and polyethylene terephtalate (PET) which has been subjected to a ion beam modification, by using the ion beam-assisted deposition method was qualitatively tested through a 3M tape testing, results of which are as shown in FIGS. 12A and 12B.

As shown in FIGS. 12A and 12B, the deposited thin film was not separated from the polymer substrate, exhibiting a strong adhesive force.

INDUSTRIAL APPLICABILITY

As so far described, the method for depositing an IO or an ITO thin film on a polymer substrate in accordance with the present invention has many advantages.

For example, it is possible to fabricate an IO or an ITO thin film, a transparent conductive thin film, on the polymer substrate at a low substrate temperature, especially at a room temperature, without damaging a transparency of the polymer substrate or the chemical stability of the surface-modified layer of the polymer substrate. And thusly fabricated IO or the ITO thin film has a remarkably improved transparency, electric characteristic and adhesive force to the polymer substrate.

What is claimed is:

1. A method for depositing an IO or an ITO thin film on a polymer substrate comprising the steps of:
   applying an, oxygen or argon ion beam to a polymer substrate, said ion beam having an acceleration energy sufficient to modify the surface of the polymer substrates;
   applying an argon or oxygen-argon mixed ion beam to a target substance consisting of $In_2O_3$, or $In_2O_3$ and $SnO_2$, under vacuum to form an IO or ITO thin film; and
   depositing the IO or ITO thin film on the polymer substrate:
   wherein, in depositing the thin film, the ion beam current density is 0–30 $\mu A/cm^2$.

2. The method of claim 1, which comprises modifying the surface of the polymer under a vacuum of between $1\times10^{-3}$ and $1\times10^{-6}$ Torr.

3. The method of claim 1, which comprises modifying the surface of the polymer using an ion beam having an acceleration voltage between 300 and 1000 V.

4. The method of claim 1, wherein, in modifying the surface of the polymer, an ion injection amount is $5\times10^{14}$–$1\times10^{17}$ ions/$cm^2$.

5. The method of claim 1, which comprises depositing the thin film on the surface-modified polymer under a vacuum of between $1\times10^{-4}$ and $1\times10^{-5}$ Torr.

6. The method of claim 1, wherein the thin film is deposited on the surface-modified polymer at an acceleration voltage of the ion beam of between is 0 and 500 V.

7. The method of claim 1, wherein in depositing the thin film on the surface-modified polymer, oxygen ions or a mixture of oxygen ions and argon ions are used as the ion beam.

8. The method of claim 1, which comprises depositing the thin film on the surface-modified polymer at a deposition temperature of between 25 and 200° C.

9. A method for depositing an IO or an ITO thin film on a polymer substrate, comprising the steps of:
   applying oxygen or argon ion beam on the polymer substrate with a certain acceleration energy to modify a surface of the polymer substrate;
   generating an ion beam from a cold cathode ion source by using argon, oxygen or its mixture gas under vacuum;
   sputtering said ion beam to a target substance consisting of $In_2O_3$ or $In_2O_3$ and $SnO_2$;
   depositing an IO or the ITO thin film on the surface-modified polymer substrate;
   wherein, in depositing the thin film, the ion beam current density is 0.5–50 $\mu A/cm^2$.

10. The method of claim 9, wherein the step of modifying the polymer surface is performed under an oxygen atmosphere.

11. The method of claim 9, which comprises modifying the surface of the polymer under a vacuum of between $1\times10^{-6}$ and $1\times10^{-6}$ Torr.

12. The method of claim 9, which comprises modifying the surface of the polymer, using an ion beam having an acceleration voltage of between 300 and 1000 V.

13. The method of claim 9, wherein, in modifying the surface of the polymer, an ion injection amount is $5\times10^{14}$–$1\times10^{17}$ ions/$cm^2$.

14. The method of claim 9, which comprises depositing the thin film on the surface-modified polymer under a vacuum of $1\times10^{-5}$ Torr as a base pressure, and a working pressure of $2\times10^{-4}$ Torr.

15. The method of claim 9, wherein, in depositing the thin film on the surface-modified polymer, argon, oxygen or their mixture gas is used as an ion gas.

16. The method of claim 9, wherein, the thin film is deposited on the surface-modified polymer at an acceleration voltage of the ion beam of between 700 and 1300 V.

17. The method of claim 9, in which comprises depositing the thin film on the surface-modified polymer at a deposition temperature below 200° C.

18. The method of claim 9, wherein, the target substance consists of 90 wt % of $In_2O_3$ and 10 wt % of $SnO_2$.

* * * * *